US011781039B2

(12) United States Patent
Ishibashi et al.

(10) Patent No.: US 11,781,039 B2
(45) Date of Patent: Oct. 10, 2023

(54) POLISHING COMPOSITION AND POLISHING METHOD

(71) Applicant: FUJIMI INCORPORATED, Kiyosu (JP)

(72) Inventors: Tomoaki Ishibashi, Kiyosu (JP); Hiroki Kon, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/473,346

(22) PCT Filed: Dec. 22, 2017

(86) PCT No.: PCT/JP2017/046154
§ 371 (c)(1),
(2) Date: Jun. 25, 2019

(87) PCT Pub. No.: WO2018/123875
PCT Pub. Date: Jul. 5, 2018

(65) Prior Publication Data
US 2020/0123413 A1 Apr. 23, 2020

(30) Foreign Application Priority Data
Dec. 26, 2016 (JP) ................. 2016-251609

(51) Int. Cl.
C01G 1/02 (2006.01)
B24B 37/04 (2012.01)
C09G 1/02 (2006.01)
C09K 3/14 (2006.01)
H01L 21/306 (2006.01)

(52) U.S. Cl.
CPC .............. *C09G 1/02* (2013.01); *B24B 37/044* (2013.01); *C09K 3/1409* (2013.01); *H01L 21/30625* (2013.01)

(58) Field of Classification Search
None
See application file for complete search history.

(56) References Cited

U.S. PATENT DOCUMENTS

| | | | | |
|---|---|---|---|---|
| 3,839,055 | A * | 10/1974 | Grossman | C03C 10/16 501/3 |
| 4,952,240 | A * | 8/1990 | Smith | C09G 1/02 106/11 |
| 6,257,965 | B1 | 7/2001 | Kamikubo et al. | |
| 6,551,974 | B1 * | 4/2003 | Conrad | C09G 1/00 510/417 |
| 7,112,123 | B2 * | 9/2006 | Fang | H01L 21/31053 451/28 |
| 8,557,133 | B2 | 10/2013 | Singh et al. | |
| 9,343,330 | B2 * | 5/2016 | Brusic | C09K 3/1463 |
| 10,428,255 | B2 | 10/2019 | Braun et al. | |
| 2002/0039875 | A1 | 4/2002 | Kobayashi | |
| 2003/0041773 | A1 * | 3/2003 | Mason | C09G 1/08 106/10 |
| 2004/0157535 | A1 * | 8/2004 | Chaneyalew | C09K 3/1463 451/41 |
| 2004/0171265 | A1 | 9/2004 | Ye et al. | |
| 2004/0216388 | A1 * | 11/2004 | Mathur | H01L 21/7684 438/692 |
| 2005/0114928 | A1 | 5/2005 | Eby et al. | |
| 2005/0233680 | A1 | 10/2005 | Fang | |
| 2005/0277367 | A1 | 12/2005 | Fang et al. | |
| 2006/0283093 | A1 * | 12/2006 | Petrovic | H01L 21/3212 51/307 |
| 2008/0102735 | A1 | 5/2008 | Bakshi et al. | |
| 2010/0083584 | A1 | 4/2010 | Kroell et al. | |
| 2010/0308258 | A1 | 12/2010 | Kroell | |
| 2013/0298471 | A1 * | 11/2013 | Cai | B24D 3/28 51/295 |
| 2014/0094032 | A1 * | 4/2014 | Yoshida | H01L 21/30625 438/693 |
| 2014/0251676 | A1 * | 9/2014 | Kurafuchi | H01L 21/4857 174/268 |
| 2015/0114928 | A1 | 4/2015 | Chu et al. | |
| 2016/0221146 | A1 * | 8/2016 | Lugg | C09G 1/02 |
| 2016/0222265 | A1 | 8/2016 | Ogata et al. | |
| 2016/0314989 | A1 * | 10/2016 | Shi | C09G 1/02 |
| 2016/0319159 | A1 * | 11/2016 | Minami | H01L 21/31053 |

(Continued)

FOREIGN PATENT DOCUMENTS

| | | |
|---|---|---|
| CN | 101528883 A | 9/2009 |
| EP | 3 103 851 A1 | 12/2016 |

(Continued)

OTHER PUBLICATIONS

Yamazaki et al (Polishing Mechanism of Glass Substrates with Its Processing Characteristics by Cerium Oxide and Manganese Oxide Slurries; Key Engineering Materials Online: Sep. 6, 2010 ISSN: 1662-9795, vols. 447-448, pp. 141-145). (Year: 2010).*

Extended European Search Report issued on Application No. 17889510, dated Dec. 2, 2019.

Office Action issued in corresponding European Patent Application No. 17889510.8 dated Apr. 19, 2021.

Non-Final Office Action on U.S. Appl. No. 17/005,857 dated Jun. 15, 2021.

(Continued)

*Primary Examiner* — Shamim Ahmed

(74) *Attorney, Agent, or Firm* — Foley & Lardner LLP

(57) ABSTRACT

Solutions are disclosed for preventing the settling of an abrasive, while maintaining the polishing performance of a polishing composition. Solutions are disclosed for improving the redispersibility of an abrasive while maintaining the polishing performance. Polishing compositions for use in polishing a semiconductor substrate according to the present disclosure include an abrasive, a layered compound, and a dispersion medium.

20 Claims, No Drawings

(56) References Cited

U.S. PATENT DOCUMENTS

| | | | |
|---|---|---|---|
| 2016/0325398 A1* | 11/2016 | Fujimoto | H01L 21/02024 |
| 2016/0358790 A1* | 12/2016 | Shi | H01L 21/67092 |
| 2019/0112196 A1 | 4/2019 | Uehara et al. | |
| 2020/0332163 A1* | 10/2020 | Matsuo | H01L 21/304 |

FOREIGN PATENT DOCUMENTS

| | | | |
|---|---|---|---|
| JP | 2002-110596 A | 4/2002 | |
| JP | 2004-336082 A | 11/2004 | |
| JP | 2008-502776 A | 1/2008 | |
| JP | 2011-110656 A | 6/2011 | |
| JP | 2012-248569 A | 12/2012 | |
| JP | 2015-165001 A | 9/2015 | |
| JP | 2016-025136 A | 2/2016 | |
| TW | 200948939 A | 12/2009 | |
| WO | WO-2008/027373 A1 | 3/2008 | |
| WO | WO-2017/187749 A1 | 11/2017 | |

OTHER PUBLICATIONS

Office Action issued in corresponding Taiwanese Patent Application No. 106145708 dated May 26, 2021 with English translation.

Final Office Action on U.S. Appl. No. 17/005,857 dated Oct. 28, 2021.

Office Action issued in corresponding Taiwanese Patent Application No. 106145708 dated Jan. 3, 2022 with English translation.

Office Action issued in Japanese Patent Application No. 2018-559406 dated Aug. 24, 2021 with English translation.

Office Action issued in corresponding Japanese Patent Application No. 2018-559406 dated Feb. 1, 2022 with English translation.

Decision of Refusal for Japanese Patent Application No. 2018-559406 dated Jul. 11, 2022.

CN Office Action in CN Appl. Ser. No. 201780080611.3 dated Aug. 25, 2022, with English translation (16 pages).

EP Office Action in EP Appl. Ser. No. 17889510.8 dated Apr. 28, 2022 (3 pages).

Office Action issued in corresponding Chinese Patent Application No. 201780080611.3 dated Apr. 1, 2023 (10 pages).

Office Action issued in corresponding Taiwanese Patent Application No. 106145708 dated May 26, 2023 (9 pages).

Office Action issued in corresponding Chinese Patent Application No. 201780080611.3 dated Jun. 25, 2023 (8 pages).

* cited by examiner

POLISHING COMPOSITION AND POLISHING METHOD

TECHNICAL FIELD

The present invention relates to a polishing composition.

BACKGROUND ART

Generally, in the polishing of a semiconductor substrate, such as a silicon wafer or silicon carbide, not to mention the improvement of surface quality accompanying increases in the performance and integration density of semiconductor devices, the improvement of production efficiency in order to deal with the increasing demands of recent years has been regarded as an important issue. As a technology for solving this problem, for example, JP 2012-248569 A discloses a polishing agent characterized by containing an oxidizing agent containing a transition metal having an oxidation reduction potential of 0.5 V or more, cerium oxide particles having an average secondary particle size of 0.5 μm or less, and a dispersion medium.

SUMMARY OF INVENTION

However, the polishing composition described in JP 2012-248569 A has been problematic in that because the dispersibility of abrasive is poor, the polishing performance is not stable, and also, during the production or use of the polishing composition, the abrasive settles in a pipe or a slurry supply tube, causing the blockage of the pipe or the like. There also is a problem in that the redispersibility of an abrasive after long-term storage is also poor.

The present invention has been accomplished in light of the above problems, and an object thereof is to provide a solution for preventing the settling of an abrasive while maintaining the polishing performance.

In addition, another object of the present invention is to provide a solution for improving the redispersibility of an abrasive while maintaining the polishing performance.

The present inventors have conducted extensive research in order to solve the above problems. As a result, they have found that the above problems can be solved by using a polishing composition containing an abrasive, a layered compound, and a dispersion medium. Further, based on the above findings, they have accomplished the present invention.

DESCRIPTION OF EMBODIMENTS

The present invention is a polishing composition for use in polishing a semiconductor substrate and the polishing composition contains an abrasive, a layered salt compound, and a dispersion medium. The polishing composition of the present invention having such a configuration is capable of preventing the settling of the abrasive while maintaining the polishing performance, such as a high polishing removal rate and the reduction of the surface roughness of the object to be polished. In addition, the polishing composition of the present invention having the above configuration is capable of improving the redispersibility of the abrasive while maintaining the polishing performance, such as a high polishing removal rate and the reduction of the surface roughness of the object to be polished.

[Object to be Polished]

The object to be polished according to the present invention is a semiconductor substrate. Examples of semiconductor substrates include single crystal semiconductor substrates made of elements in Group 14, such as a single-crystalline silicon substrate (silicon wafer), a single crystal germanium substrate, and a single crystal silicon-germanium substrate; compound semiconductor substrates such as a SiC substrate, a SiGe substrate, a ZnS substrate, a ZnSe substrate, an InP substrate, an AlN substrate, a GaAs substrate, a GaN substrate, an AlGaAs substrate, an InGaAs substrate, a GaP substrate, a ZnTe substrate, and a CdTd substrate; and the like. Among them, compound semiconductor substrates are preferable, and a SiC substrate is more preferable.

Next, the configuration of the polishing composition of the present invention will be described in detail.

[Abrasive]

The polishing composition of the present invention contains an abrasive. An abrasive has the function of mechanically polishing the object to be polished.

Specific examples of an abrasive used in the present invention include metal oxides such as aluminum oxide (alumina), silicon oxide (silica), cerium oxide (ceria), zirconium oxide, titanium oxide (titania), and manganese oxide, metal carbides such as silicon carbide and titanium carbide, metal nitrides such as silicon nitride and titanium nitride, metal borides such as titanium boride and tungsten boride, and the like. The abrasive may be used alone, and it is also possible to use a mixture of two or more kinds. In addition, the abrasive used may be a commercially available product or a synthetic product.

Among these abrasives, from the standpoint that various particle sizes are easily accessible and an excellent polishing removal rate can be obtained, at least one member selected from the group consisting of metal oxides and metal carbides is preferable, and an aluminum oxide is more preferable.

The lower limit of the average secondary particle diameter of the abrasive is preferably 0.01 μm or more, more preferably 0.05 μm or more, still more preferably 0.1 μm or more, and particularly preferably 0.2 μm or more. As the average secondary particle diameter of the abrasive increases, the polishing removal rate of the object to be polished improves. In addition, the upper limit of the average secondary particle diameter of the abrasive is preferably 10.0 μm or less, more preferably 5.0 μm or less, still more preferably 3.0 μm or less, yet more preferably 1.8 μm or less, still yet more preferably 1.5 μm or less, particularly preferably 1.0 μm or less, and most preferably 0.5 μm or less. As the volume average particle diameter of the abrasive decreases, it becomes easier to obtain a surface having reduced roughness with less defects. From above, the average secondary particle diameter of the abrasive is still more preferably 0.1 μm or more and 3.0 μm or less, and particularly preferably 0.2 μm or more and 1.0 μm or less.

Incidentally, unless otherwise noted, the average secondary particle diameter of the abrasive herein is measured based on a laser diffraction scattering method. Specifically, the measurement can be performed using a laser diffraction/scattering particle size distribution measuring device manufactured by HORIBA Co., Ltd., (trade name "LA-950").

The lower limit of the abrasive content in the polishing composition is preferably 0.1 mass % or more, more preferably 1 mass % or more, and still more preferably 3 mass % or more. As the abrasive content increases, the polishing removal rate increases.

In addition, the upper limit of the abrasive content in the polishing composition is preferably 30 mass % or less, still more preferably 25 mass % or less, and more preferably 10 mass % or less. As the abrasive content decreases, the production cost of the polishing composition decreases. In addition, as a result of polishing using the polishing composition, a surface with less defects, such as scratches, can be obtained.

[Layered Compound]

In the polishing composition of the present invention, a layered compound forms a weak bond with abrasive particles while attracting each other due to the intermolecular force, electrostatic action, or the like with the abrasive, and thus can be present to serve as a steric hindrance between the abrasive particles. Accordingly, the aggregation of abrasive is suppressed, and therefore, presumably, the effects of the present invention, that is, preventing settling or improving redispersibility while maintaining the polishing performance, can be obtained.

In addition, when the polishing composition after adjustment is stored at a predetermined temperature for a predetermined period of time, the interactions between the layered compound and abrasive particles described above, such as the formation of a bond, are promoted, presumably further improving the anti-settling effect or redispersibility improving effect on the abrasive.

Incidentally, the above mechanisms are based on presumption, and whether they are right or wrong does not affect the technical scope of the present invention.

The layered compound used in the present invention is not particularly limited as long as the above effects are developed. Examples thereof include clay minerals such as a layered silicate compound, a layered niobate compound having a two-dimensional sheet structure formed of $NbO_6$ octahedron units, a layered titanate compound having a layer structure formed of planarly connected $TiO_5$ triangular bipyramids or a two-dimensional sheet structure formed of $TiO_6$ octahedron units, a metal phosphate in which OH groups of phosphoric acid are present between layers, a layered double hydroxide including a hydroxide layer containing divalent and trivalent metal ions, in which anions are present between layers, a metal chalcogen compound having a structure in which metal atoms are surrounded by chalcogen atoms in the shape of a regular octahedron or triangular prism, a boron nitride having a structure in which strongly bonded atomic layers are laminated, and graphite such as natural graphite and artificial graphite.

More specifically, for example, examples of layered niobate compounds include $K_4Nb_6O_{17}$, $KNb_3O_8$, $HNb_3O_8$, $NaNbO_3$, $LiNbO_3$, $Cs_4Nb_6O_{17}$, and the like, examples of layered titanate compounds include $Na_2Ti_3O_7$, $K_2Ti_4O_9$, $K_2Ti_2O_5$, $Cs_2Ti_5O_{11}$, $Cs_2Ti_6O_{13}$, and the like, examples of metal phosphates include layered zirconium phosphates, such as $\alpha$-$Zr(HPO_4)_2$ and $\gamma$-$ZrPO_4 \cdot H_2PO_4$, and the like, examples of layered double hydroxides include hydrotalcite and the like, and examples of metal chalcogen compounds include $MoS_2$, $WS_2$, $TaS_2$, $NbS_2$, and the like. These layered compounds may be used alone, and it is also possible to use a combination of two or more kinds. Among the above layered compounds, from the standpoint that the effects of the present invention are obtained stably and efficiently, a layered silicate compound is preferable. Hereinafter, a layered silicate compound will be described.

(Layered Silicate Compound)

A layered silicate compound is basically structured such that silicic acid tetrahedrons are planarly connected, and is a structure characterized by containing, in the unit structure, one or two silicic acid tetrahedron sheets and one alumina or magnesia octahedron sheet. Between its layers (between unit structures), cations of sodium, potassium, calcium, and the like are present. In addition, the layered silicate compound is a substance having such properties that crystals are thin and peel off.

The layered silicate compound used in the present invention may be a natural product, a synthetic compound, a commercially available product, or a mixture thereof. Examples of methods for synthesizing a layered silicate compound include a hydrothermal synthesis reaction method, a solid-phase reaction method, a melt synthesis method, and the like.

Specific examples of the layered silicate compound include talc, pyrophyllite, smectite (saponite, hectorite, sauconite, stevensite, bentonite, montmorillonite, beidellite, nontronite, etc.), vermiculite, mica (phlogopite, biotite, zinnwaldite, muscovite, palagonite, celadonite, glauconite, etc.), chlorite (clinochlore, chamosite, nimite, pennantite, sudoite, donbassite, etc.), brittle mica (clintonite, margarite, etc.), thulite, serpentine (antigorite, lizardite, chrysotile, amesite, cronstedtite, berthierine, greenalite, garnierite, etc.), kaolin (kaolinite, dickite, nacrite, halloysite, etc.), and the like.

These layered silicate compounds may be used alone, and it is also possible to use a combination of two or more kinds. Among them, in terms of having excellent thixotropy and swellability, and being more likely to improve the anti-settling properties and redispersibility of the abrasive, bentonite (sodium bentonite), hectorite (sodium hectorite), and mica (sodium tetrasilisic mica) are preferable, and bentonite (sodium bentonite) is more preferable.

The lower limit of the particle size of the layered silicate compound is preferably 0.01 μm or more, more preferably 0.02 μm or more, and still more preferably 0.05 μm or more. As the particle size of the layered silicate compound increases, the anti-settling properties and redispersibility of the abrasive improve. In addition, the upper limit of the particle size of the layered silicate compound is preferably 10 μm or less, more preferably 8 μm or less, and still more preferably 5 μm or less. As the particle size of the layered silicate compound decreases, the surface accuracy improves.

Incidentally, as used herein, the particle size of the layered silicate compound is defined as a value determined using an electron microscope. More specifically, the particle size of a layered silicate compound can be measured by the method described in the Examples.

The lower limit of the layered compound content in the polishing composition is preferably 0.01 mass % or more, and more preferably 0.02 mass % or more. In addition, the upper limit of the layered compound content in the polishing composition is preferably 5 mass % or less, and more preferably 2 mass % or less. Within this range, the effects of the present invention described above can be obtained efficiently.

[Dispersion Medium]

The polishing composition according to the present invention contains a dispersion medium for dispersing each component. As the dispersion medium, water is preferable. In terms of suppressing the inhibition of the action of other components, water containing as little impurities as possible is preferable. Specifically, pure water, ultrapure water, or distilled water obtained by removing impurity ions with an ion exchange resin, and then removing contaminants through a filter, is preferable.

[pH of Polishing Composition]

The lower limit of the pH of the polishing composition of the present invention is not particularly limited, but is preferably 1.0 or more, more preferably 3.0 or more, still more preferably 5.0 or more, and most preferably 7.0 or more. In addition, the upper limit of the pH is not particularly limited, but is preferably 13.0 or less, more preferably 12.0 or less, still more preferably 11.0 or less, and particularly preferably 10.0 or less.

The pH of the polishing composition can be adjusted by adding the acid or salt thereof or the base or salt thereof described below.

[Acid or Salt Thereof]

The polishing composition of the present invention preferably contains an acid or a salt thereof. The acid or salt thereof plays the role of adjusting the pH of the polishing composition.

As the acid, inorganic acids and organic acids are both usable. Examples of inorganic acids include hydrochloric acid, sulfuric acid, nitric acid, fluoric acid, boric acid, carbonic acid, phosphinic acid, phosphorous acid, phosphoric acid, and the like. In addition, examples of organic acids include formic acid, acetic acid, propionic acid, butanoic acid, valeric acid, 2-methylbutanoic acid, n-hexanoic acid, 3,3-dimethylbutanoic acid, 2-ethylbutanoic acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, phenoxyacetic acid, methanesulfonic acid, ethanesulfonic acid, sulfosuccinic acid, benzenesulfonic acid, toluenesulfonic acid, phenylphosphonic acid, hydroxyethane-1,1-diphosphonic acid, and the like. Further, examples of salts include Group 1 element salts, Group 2 element salts, aluminum salts, ammonium salts, amine salts, quaternary ammonium salts, and the like. These acids or salts thereof may be used alone, and it is also possible to use a combination of two or more kinds. Among them, nitric acid and sulfuric acid are preferable.

The content of the acid or salt thereof in the polishing composition may be suitably adjusted to make the pH within the above pH range.

[Base or Salt Thereof]

In order to adjust the pH within the above range, a base or a salt thereof may also be used. Examples of bases or salts thereof include amines such as aliphatic amines and aromatic amines, organic bases such as quaternary ammonium hydroxide, hydroxides of alkali metals such as sodium hydroxide and potassium hydroxide, hydroxides of elements in Group 2 such as magnesium hydroxide and calcium hydroxide, ammonia, and the like.

The content of the base or salt thereof in the polishing composition may be suitably adjusted to make the pH within the above pH range.

[Other Components]

The polishing composition of the present invention may further contain other components as necessary, such as an oxidant that oxidizes the surface of the object to be polished, a water-soluble polymer that acts on the surface of the object to be polished or the surface of the abrasive, an anticorrosive agent that suppresses the corrosion of the object to be polished, and a chelating agent, as well as an antiseptic agent, an antifungal agent, and the like having other functions.

Examples of oxidants include peroxides such as hydrogen peroxide and urea peroxide; peracids such as peracetic acid; percarbonates such as sodium percarbonate; nitric acid compounds such as nitric acid, as well as iron nitrate, silver nitrate, and aluminum nitrate which are salts thereof and ceric ammonium nitrate which is a complex thereof; persulfuric acid compounds such as persulfuric acids including potassium peroxymonosulfate, peroxodisulfuric acid, and the like, as well as ammonium persulfate and potassium persulfate which are salts thereof; chlorine compounds such as chloric acid, as well as salts thereof, and perchloric acid, as well as potassium perchlorate which is a salt thereof; bromine compounds such as bromic acid, as well as potassium bromate which is a salt thereof; iodine compounds such as iodic acid, as well as ammonium iodate which is a salt thereof, and periodic acid, as well as sodium periodate and potassium periodate which are salts thereof; ferric acids such as ferric acid, as well as potassium ferrate which is a salt thereof; permanganic acids such as permanganic acid, as well as sodium permanganate and potassium permanganate which are salts thereof; chromic acids such as chromic acid, as well as potassium chromate and potassium dichromate which are salts thereof; vanadic acids such as vanadic acid, as well as ammonium vanadate, sodium vanadate, and potassium vanadate which are salts thereof; ruthenium acids such as perruthenium acid and salts thereof; molybdic acids such as molybdic acid, as well as ammonium molybdate and disodium molybdate which are salts thereof; rhenic acids such as perrhenium and salts thereof; and tungstic acids such as tungstic acid, as well as disodium tungstate which is a salt thereof. These oxidants may be used alone, and it is also possible to use a combination of two or more kinds. Among them, permanganic acid or a salt thereof, chromic acid or a salt thereof, and ferric acid or a salt thereof are preferable, and sodium permanganate and potassium permanganate are more preferable.

The lower limit of the oxidant content in the polishing composition is preferably 0.1 mass % or more, and more preferably 0.5 mass % or more. In addition, the upper limit of the oxidant content in the polishing composition is preferably 10 mass % or less, and more preferably 5 mass % or less.

Examples of water-soluble polymers include polycarboxylic acids such as polyacrylic acid, polysulfone acids such as polyphosphonic acid and polystyrene sulfonate, polysaccharides such as xanthan gum and sodium alginate, cellulose derivatives such as hydroxyethyl cellulose and carboxymethyl cellulose, polyethylene glycol, polyvinyl alcohol, polyvinylpyrrolidone, polyoxyethylene alkyl ethers, polyoxyethylene alkyl phenyl ethers, sorbitan monooleate, oxyalkylene-based polymers having one or more kinds of oxyalkylene units, and the like. In addition, salts of the above compounds are also suitable as water-soluble polymers.

Examples of anticorrosive agents include amines, pyridines, tetraphenyl phosphonium salts, benzotriazoles, triazoles, tetrazoles, benzoic acid, and the like. Examples of chelating agents include carboxylic acid-based chelating agents such as gluconic acid, amine-based chelating agents such as ethylenediamine, diethylenetriamine, and trimethyltetramine, polyaminopolycarbon-based chelating agents such as ethylenediaminetetraacetic acid, nitrilotriacetic acid, hydroxyethyl ethylenediamine triacetic acid, triethylenetraminehexaacetic acid, and diethylenetriaminepentaacetic acid, organophosphonic acid-based chelating agents such as 2-aminoethylphosphonic acid, 1-hydroxyethylidene-1,1-diphosphonic acid, aminotri(methylene phosphonic acid), ethylenediamine tetrakis(methylene phosphonic acid), diethylenetriamine penta(methylene phosphonic acid), ethane-1,1-diphosphonic acid, ethane-1,1,2-triphosphonic acid, methanehydroxyphosphonic acid, and 1-phosphonobutane-2,3,4-tricarboxylic acid, phenol derivatives, 1,3-diketone, and the like.

Examples of antiseptic agents include sodium hypochlorite and the like. Examples of antifungal agents include oxazolines such as oxazolidine-2,5-dione and the like.

[Method for Producing Polishing Composition]

The method for producing the polishing composition of the present invention is not particularly limited. For example, the polishing composition can be obtained by stir-mixing an abrasive and a layered compound, together with other components as necessary, in a dispersion medium.

The temperature at the time of mixing the components is not particularly limited, but is preferably 10° C. or more and 40° C. or less, and it is also possible to perform heating in order to increase the dissolution speed. In addition, the mixing time is not particularly limited either.

[Polishing Method]

As described above, the polishing composition of the present invention is suitable for use in polishing a semiconductor substrate.

For polishing an object to be polished using the polishing composition of the present invention, polishing can be performed using a machine and conditions that are used in usual polishing. Common polishing machines include single-side polishing machines and double-side polishing machines. In a single-side polishing machine, an object to be polished (preferably an object to be polished in the shape of a substrate) is held using a holding tool called a carrier, then, while supplying the polishing composition, a platen having attached thereto a polishing pad is pressed against one side of the object to be polished, and the platen is rotated, whereby one side of the object to be polished is polished. In a double-side polishing machine, an object to be polished is held using a holding tool called a carrier, then, while supplying the polishing composition from above, platens having attached thereto a polishing pad are pressed against the opposed surfaces of the object to be polished, and they are rotated in relative directions, whereby both sides of the object to be polished are polished. At this time, the object is polished by the physical action due to the friction of the polishing pad, the polishing composition, and the object to be polished and also by the chemical action caused by the polishing composition on the object to be polished.

As the polishing pad used in the polishing method using the polishing composition of the present invention, various types are available, including, for example, those made of different materials such as a polyurethane type, a polyurethane foam type, a nonwoven fabric type, and a suede type, those having different physical properties such as hardnesses, thicknesses, and the like, and those containing an abrasive, not containing an abrasive, or the like, and they can be used without limitations.

As described above, in terms of promoting the formation of weak interactions between the layered compound and abrasive particles to further suppress the settling of the abrasive and further improve the redispersibility of the abrasive, it is preferable that the polishing composition of the present invention after production is stored at a predetermined temperature for a predetermined period of time, and a semiconductor substrate, which is the object to be polished, is polished using the polishing composition after such storage.

That is, the present invention also provides a polishing method including a step of storing the polishing composition of the present invention at a temperature of 10° C. or more for 20 days or more after production, and a step of polishing a semiconductor substrate using the polishing composition after storage.

Specifically, the lower limit of the storage temperature is preferably 10° C. or more, and more preferably 40° C. or more. In addition, the upper limit of the storage temperature is not particularly limited, and is preferably 80° C. or less, and more preferably 60° C. or less.

Further, the lower limit of the storage time period is preferably 20 days or more, and more preferably 60 days or more. In addition, the upper limit of the storage time period is not particularly limited.

When an object to be polished is polished using the polishing composition of the present invention, it is possible that the polishing composition once used for polishing is recovered and used again for polishing. As an example of the method for reusing the polishing composition, a method in which the polishing composition discharged from the polishing machine is recovered in a tank, recirculated into the polishing machine, and used can be mentioned. The use in recycle of the polishing composition is advantageous in that the amount of polishing composition discharged as liquid waste is reduced, whereby the environmental stress can be reduced, and also the amount of polishing composition used is reduced, whereby the production cost of polishing the object to be polished can be suppressed.

When the polishing composition of the present invention is used in recycle, the abrasive, layered compound, and other additives consumed/lost during polishing can be partially or entirely added as a composition adjusting agent during the use in recycle. In this case, the composition adjusting agent may be a mixture of some or all of the abrasive, layered compound, and other additives at an arbitrary mixing ratio. By additionally adding the composition adjusting agent, the polishing composition is adjusted to be a composition suitable for reuse, and polishing is suitably maintained. The concentrations of the abrasive, layered compound, and other additives contained in the composition adjusting agent are arbitrary and not particularly limited, but are preferably suitably adjusted according to the size of the recycle tank and the polishing conditions.

The polishing composition of the present invention may be a one-agent type or may also be a multi-agent type such as a two-agent type. In addition, the polishing composition of the present invention may be prepared by diluting a stock solution of the polishing composition by 10 times or greater with a diluent such as water, for example.

EXAMPLES

The present invention will be described in further detail using the following examples and comparative examples. However, the technical scope of the present invention is not limited only to the following examples.

Examples 1 to 6 and Comparative Examples 1 to 3

(Preparation of Polishing Composition)

An abrasive dispersion (average secondary particle diameter: 0.4 µm) were diluted with water to the abrasive content of 6 mass %, a layered silicate compound or another alternative compound was added to the content shown in Table 1 below, and further potassium permanganate was added to a content of 1 mass %, followed by stirring at room temperature (25° C.), thereby preparing a dispersion. Subsequently, an aqueous potassium hydroxide solution was added to the dispersion as a base, and, while checking with a pH meter, the dispersion was adjusted to pH 9.0. Polishing compositions of Examples 1 to 6 and Comparative Examples 1 to 3 were thus obtained.

<Abrasive>

Aluminum oxide (alumina): The average secondary particle diameter was measured using a laser diffraction/scattering particle size distribution measuring device manufactured by HORIBA Co., Ltd., (trade name "LA-950").

<Layered Silicate Compound>

Bentonite: Particle size 1.3
Hectorite: Particle size 4.0 μm or 0.15

Incidentally, the particle size of the layered silicate compound was determined by the following measurement. That is, using a scanning electron microscope "SU8000" manufactured by Hitachi High-Technologies Corporation, 100 layered silicate compound particles are observed, and the smallest rectangle circumscribed to each particle image is drawn. Then, with respect to each rectangle drawn per particle image, the length of the longer side was measured, and their average was defined as the particle size of the layered silicate compound.

(Evaluation of Anti-Settling Properties of Abrasive)

Using a polishing composition that had been stored at 25° C. for 1 to 2 days after preparation, the polishing composition was placed in a 100-ml-volume colorimetric tube (manufactured by AS ONE Corporation) to fill the 100-ml mark and allowed to stand for 2 hours. After standing, the scale indicating the level of the interface between the abrasive layer and the supernatant was read and rated according to the following criteria. A rating of C or higher is acceptable:

AAA: More than 80 ml
AA: More than 60 ml and 80 ml or less
A: More than 40 ml and 60 ml or less
B: More than 30 ml and 40 ml or less
C: More than 20 ml and 30 ml or less
D: 20 ml or less.

(Evaluation of Redispersibility of Abrasive)

Using a polishing composition that had been stored at 25° C. for 1 to 2 days after preparation, the polishing composition was placed in a 1000-ml-volume PP container (manufactured by AS ONE Corporation) to fill the 800-ml mark and allowed to stand for 72 hours. After standing, the PP container was shaken up and down, and the number of times until the precipitated abrasive were redispersed and disappeared was measured and rated according to the following criteria. Ratings of A to C are acceptable:

A: 1 to 3
B: 4 to 6
C: 7 to 9
D: 10 or more.

(Evaluation of Polishing)

Using a polishing composition that had been stored at 25° C. for 1 to 2 days after preparation, polishing was performed under the following polishing conditions, and the polishing removal rate was determined. In addition, the surface roughness of each object to be polished after polishing was measured by the following method:

<Polishing Conditions>

Polishing machine: EJ-380IN (manufactured by Engis Japan Corporation)
Polishing pad: SUBA800 (manufactured by Nitta Haas Incorporated)
Polishing pressure: 300 g/cm$^2$
Platen rotational speed: 80 rpm
Polishing time: 30 min <Object to be Polished>

SiC substrate: 2-inch, N type 4H—SiC, 4° off.

<Polishing Removal Rate>

The polishing removal rate was calculated from the difference in mass of the object to be polished before and after polishing.

<Surface Roughness Ra>

The surface roughness Ra of the object to be polished after polishing was measured using an atomic force microscope (NX-HDM manufactured by Park Systems). Incidentally, the surface roughness Ra is a parameter that indicates the average amplitude of the roughness curve in the height direction, and shows the arithmetical mean height of the surface of the object to be polished within a certain field of view.

The compositions and the evaluation results of the polishing compositions of Examples 1 to 6 and Comparative Examples 1 to 3 are shown in Table 1 below. Incidentally, "-" in Table 1 below means that the component was not added.

TABLE 1

| | Abrasive | | Oxidant | | Layered compound or other compounds | | | Evaluation results | | | |
|---|---|---|---|---|---|---|---|---|---|---|---|
| | | | | | | | | | | Polishing | |
| | Kind | Content (mass %) | Kind | Content (mass %) | Kind | Particle size (μm) | Content (mass %) | Abrasive anti-settling properties | Abrasive redispersibility | removal rate (μm/h) | Surface roughness Ra (nm) |
| Example 1 | Alumina | 6 | Potassium permanganate | 1 | Hectorite | 4.0 | 0.2 | A | A | 1.5 | 0.06 |
| Example 2 | Alumina | 6 | Potassium permanganate | 1 | Bentonite | 1.3 | 0.2 | A | A | 1.5 | 0.06 |
| Example 3 | Alumina | 6 | Potassium permanganate | 1 | Hectorite | 0.15 | 0.1 | B | C | 1.5 | 0.06 |
| Example 4 | Alumina | 6 | Potassium permanganate | 1 | Hectorite | 0.15 | 0.2 | B | B | 1.4 | 0.06 |
| Example 5 | Alumina | 6 | Potassium permanganate | 1 | Hectorite | 0.15 | 0.5 | A | A | 1.2 | 0.06 |
| Example 6 | Alumina | 6 | Potassium permanganate | 1 | Hectorite | 0.15 | 0.05 | C | C | 1.5 | 0.06 |

TABLE 1-continued

| | Abrasive | | Oxidant | | Layered compound or other compounds | | | Evaluation results | | Polishing | |
|---|---|---|---|---|---|---|---|---|---|---|---|
| | Kind | Content (mass %) | Kind | Content (mass %) | Kind | Particle size (μm) | Content (mass %) | Abrasive anti-settling properties | Abrasive redispersibility | removal rate (μm/h) | Surface roughness Ra (nm) |
| Comparative Example 1 | Alumina | 6 | Potassium permanganate | 1 | — | — | — | D | D | 1.5 | 0.07 |
| Comparative Example 2 | Alumina | 6 | Potassium permanganate | 1 | Polyacrylate | — | 0.5 | C | D | 1.5 | 0.06 |
| Comparative Example 3 | Alumina | 6 | Potassium permanganate | 1 | Polyacrylate | — | 5 | B | D | 1.4 | 0.06 |

As is clear from Table 1 above, in the case of using the polishing compositions of the examples containing a layered compound, favorable results were obtained in terms of the anti-settling properties and redispersibility of the abrasive and also the polishing performance. In particular, it turned out that as compared with Comparative Example 1 where no layered compound was added, the anti-settling properties and redispersibility of the abrasive improve while maintaining the polishing performance, such as polishing removal rate and Ra. In addition, it turned out that as compared with Comparative Examples 2 and 3 where other dispersants were used, the redispersibility of the abrasive improves while maintaining the polishing performance, such as polishing removal rate and Ra.

Examples 7 to 12, Comparative Example 4: Examination of Storage Conditions

With respect to the polishing composition prepared in Example 2 above, using the polishing composition after storage at the storage temperature for the number of days of storage shown in Table 2 below, the above (Evaluation of Anti-settling Properties of Abrasive), (Evaluation of Redispersibility of Abrasive), and (Evaluation of Polishing) were performed.

In addition, with respect to the polishing composition after storage, the measurement of viscosity and the evaluation of abrasive aggregation/hardening suppression ability were performed as follows.

(Measurement of Viscosity)

The polishing composition prepared in each example was charged in a Brookfield viscometer TVB-10 manufactured by Toki Sangyo Co., Ltd., and the viscosity was measured at a measurement temperature of 25° C. and a rotational speed of 100 rpm. The kind of rotor used in the measurement is H3.

(Evaluation of Abrasive Aggregation/Hardening Suppression Ability)

Using the polishing composition prepared in each example, the polishing composition was placed in a 1000-ml-volume polypropylene container (manufactured by AS ONE Corporation) to fill the 800-ml mark and allowed to stand for 72 hours. After standing, the polypropylene container was softly laid on its side, and the condition of the lower part of the container was visually observed and rated according to the following criteria. Ratings of A and B are acceptable:

A: No precipitate remains on the bottom or wall of the container

B: No precipitate remains on the bottom of the container, but residues are seen on the wall of the container C: Precipitates remain on the bottom of the container.

The evaluation results of Examples 7 to 12 are shown in Table 2 below together with the results of Example 2.

In addition, with respect to the polishing composition prepared in Comparative Example 1 above, using the polishing composition after storage at the storage temperature for the number of days of storage shown in Table 2 below, (Evaluation of Anti-settling Properties of Abrasive), (Evaluation of Redispersibility of Abrasive), (Evaluation of Polishing) (Measurement of Viscosity), and (Evaluation of Abrasive Aggregation/Hardening Suppression Ability) were performed. The results are shown in Comparative Example 4 in Table 2 below.

TABLE 2

| | Storage conditions | | Evaluation results | | | | | |
|---|---|---|---|---|---|---|---|---|
| | Storage temperature (° C.) | Number of days of storage (days) | Viscosity (mPa · s) | Abrasive anti-settling properties | Abrasive redispersibility | Abrasive aggregation/hardening suppression ability | Polishing removal rate (μm/h) | Surface roughness Ra (nm) |
| Example 2 | 25 | 2 | 19 | A | A | B | 1.5 | 0.06 |
| Example 7 | 25 | 20 | — | A | A | A | 1.5 | 0.07 |
| Example 8 | 25 | 60 | — | AA | A | A | 1.5 | 0.06 |
| Example 9 | 25 | 90 | 21 | AA | A | A | 1.5 | 0.06 |
| Example 10 | 43 | 20 | — | AA | A | A | 1.5 | 0.06 |
| Example 11 | 43 | 60 | — | AAA | A | A | 1.5 | 0.06 |
| Example 12 | 43 | 90 | 23 | AAA | A | A | 1.5 | 0.05 |
| Comparative Example 4 | 25 | 90 | <10 | D | D | C | 1.5 | 0.07 |

As is clear from Table 2 above, it turned out that in the case where a polishing composition that has been stored at a temperature of 25° C. or more for 20 days or more after its production is used, as compared with Example 2, the abrasive aggregation/hardening suppression ability further improves.

In addition, it turned out that the viscosities of the polishing compositions of Example 9 and Example 12 are higher than the viscosity of the polishing composition of Example 2. This presumably suggests that the aggregation of abrasive was suppressed, and the space between the abrasive and the solvent increased, resulting in an increase in the area of contact between the abrasive and the solvent, whereby the shearing viscosity increased. Accordingly, presumably, the abrasive contained in the polishing compositions of Examples 7 to 12 have further improved dispersibility.

It turned out that in the case of the polishing composition of Comparative Example 4 containing no layered compound, even when storage was continued for an increased number of days, the abrasive anti-settling properties, abrasive redispersibility, and abrasive aggregation/hardening suppression ability are all lower than in Examples 7 to 12. In addition, it turned out that the viscosity of the polishing composition of Comparative Example 4 is even lower than the viscosity of the polishing composition of Example 2. This presumably suggests that the aggregation of the abrasive progressed, and the space between the abrasive and the solvent decreased, resulting in a decrease in the area of contact between the abrasive and the solvent, whereby the shearing viscosity decreased. Accordingly, presumably, the abrasive contained in the polishing composition of Comparative Example 4 have reduced dispersibility.

Incidentally, this application is based on Japanese Patent Application No. 2016-251609 filed on Dec. 26, 2016, the contents of which are entirely incorporated herein by reference.

The invention claimed is:

1. A polishing composition for use in polishing a semiconductor substrate, the polishing composition comprising:
an abrasive present in the polishing composition at a concentration of 0.1 mass % or more and 10 mass % or less, wherein the abrasive is selected from the group consisting of alumina, silica, zirconium oxide, silicon carbide, titanium carbide, silicon nitride, titanium nitride, titanium boride, tungsten boride, and combinations thereof;
a layered compound having a two-dimensional sheet structure, wherein the layered compound is present in the polishing composition at a concentration of 0.02 mass % or more and 2 mass % or less;
an oxidant selected from the group consisting of permanganic acid, sodium permanganate, potassium permanganate, and combinations thereof; and
a dispersion medium consisting of water,
wherein:
the polishing composition does not comprise a ceria abrasive;
the abrasive has an average secondary particle diameter of 3.0 µm or less; and
the abrasive is dispersed in the dispersion medium.

2. The polishing composition according to claim 1, wherein the layered compound is a layered silicate compound.

3. The polishing composition of claim 2, wherein a particle size of the layered silicate compound is 0.01 µm or more and 5 µm or less.

4. The polishing composition according to claim 1, wherein the abrasive has an average secondary particle diameter of 1.8 µm or less.

5. The polishing composition according to claim 1, wherein the semiconductor substrate is a compound semiconductor substrate.

6. The polishing composition of claim 1, wherein the abrasive is alumina.

7. The polishing composition of claim 1, wherein the polishing composition comprises an acid or salt thereof or a base or salt thereof.

8. The polishing composition of claim 1, wherein a content of the oxidant is 0.1 mass % or more and 5 mass % or less.

9. The polishing composition of claim 1, wherein the abrasive has an average secondary particle diameter of 1.0 µm or less.

10. The polishing composition of claim 1, wherein the oxidant is potassium permanganate.

11. The polishing composition of claim 1, wherein the layered compound is present in the polishing composition at a concentration of 0.02 mass % or more and 0.5 mass % or less.

12. The polishing composition of claim 1, wherein:
the oxidant is present in the polishing composition at a concentration of 0.1 mass % or more and 10 mass % or less; and
the water is present in the polishing composition at a concentration of 78 mass % or more.

13. A polishing method comprising:
storing the polishing composition according to claim 1 at a temperature of 10° C. or more for 20 days or more after production; and
polishing a semiconductor substrate using the polishing composition after storage.

14. A polishing composition for use in polishing a semiconductor substrate, the polishing composition comprising:
an abrasive present in the polishing composition at a concentration of 0.1 mass % or more and 10 mass % or less, wherein the abrasive is alumina;
a layered compound having a two-dimensional sheet structure, wherein the layered compound is present in the polishing composition at a concentration of 0.02 mass % or more and 2 mass % or less;
an oxidant selected from the group consisting of permanganic acid, sodium permanganate, potassium permanganate, and combinations thereof; and
a dispersion medium consisting of water;
wherein the abrasive is dispersed in the dispersion medium.

15. The polishing composition of claim 14, wherein a content of the oxidant is 0.1 mass % or more and 5 mass % or less.

16. The polishing composition of claim 14, wherein the layered compound is a layered silicate compound.

17. The polishing composition of claim 16, wherein a particle size of the layered silicate compound is 0.01 µm or more and 5 µm or less.

18. The polishing composition of claim 14, wherein the oxidant is potassium permanganate.

19. The polishing composition of claim 14, wherein the layered compound is present in the polishing composition at a concentration of 0.02 mass % or more and 0.5 mass % or less.

20. The polishing composition of claim 14, wherein:
the oxidant is present in the polishing composition at a concentration of 0.1 mass % or more and 10 mass % or less; and
the water is present in the polishing composition at a concentration of 78 mass % or more.

* * * * *